United States Patent [19]

Shimoji

[11] Patent Number: 5,396,458

[45] Date of Patent: Mar. 7, 1995

[54] SEMICONDUCTOR MEMORY DEVICE AND METHOD OF WRITING AND READING OUT INFORMATION FOR THE SAME

[75] Inventor: Noriyuki Shimoji, Kyoto, Japan

[73] Assignee: Rohm Co., Ltd., Kyoto, Japan

[21] Appl. No.: 963,694

[22] Filed: Oct. 20, 1992

[30] Foreign Application Priority Data

Oct. 21, 1991 [JP] Japan .................................. 3-272726

[51] Int. Cl.⁶ .............................................. G11C 7/00
[52] U.S. Cl. ............................... 365/185; 365/189.01; 365/182; 365/200
[58] Field of Search ................... 365/185, 189.01, 182, 365/218, 104, 900, 200, 201; 257/322

[56] References Cited

U.S. PATENT DOCUMENTS

| | | | |
|---|---|---|---|
| 4,173,791 | 11/1979 | Bell | 365/185 |
| 4,366,555 | 12/1986 | Hu | 365/185 |
| 4,462,089 | 7/1984 | Miida et al. | 257/322 |
| 4,930,105 | 5/1990 | Matsumoto et al. | 365/182 |
| 4,961,165 | 10/1990 | Ema | 365/185 |
| 4,999,812 | 3/1991 | Amin | 365/900 |
| 5,016,215 | 5/1991 | Tigelaar | 365/185 |
| 5,060,195 | 10/1991 | Gill et al. | 365/185 |
| 5,172,338 | 12/1992 | Mehrotra et al. | 365/185 |

Primary Examiner—Eugene R. LaRoche
Assistant Examiner—Tan Nguyen
Attorney, Agent, or Firm—Steven M. Rabin

[57] ABSTRACT

In a semiconductor memory device, when positive high voltages are respectively applied to a control gate(20) and a drain region(14) and a source region(13) is grounded, hot electrons are produced in the boundary between the drain region(14) and a channel region. The hot electrons are injected into a floating gate(18) through a tunnel oxide film(17). Consequently, information is written. At the time of reading out information, the drain region(14) is grounded, a positive read voltage is applied to the source region(13), and a predetermined sense voltage is applied to the control gate(20). At this time, the area between the source and the drain is kept in a non-conduction state if electrons are stored in the floating gate(18), while conduction occurs between the source and the drain if no electrons are stored therein. Since no hot electrons are produced in the boundary between the drain region(14) and the channel region at the time of reading, it is possible to effectively prevent so-called soft writing.

12 Claims, 8 Drawing Sheets

SEMICONDUCTOR MEMORY DEVICE AND METHOD OF WRITING AND READING OUT INFORMATION FOR THE SAME

BACKGROUND OF THE INVENTION

1. Field of the Invention

The present invention relates to a semiconductor memory device suitably implemented by an EPROM (Erasable Programmable Read-Only Memory), an EEPROM (Electrically Erasable and Programmable Read-Only Memory) or the like and using as a memory cell a transistor having a floating gate, and a method of writing and reading out information for the semiconductor memory device.

2. Description of the Prior Art

A transistor, which has a structure shown in FIG. 10, having a floating gate has been conventionally applied to a memory cell of an electrically programable ROM (Read-Only Memory) such as an EPROM or an EEPROM. More specifically, an $n^+$-type impurity region having a high concentration is provided on a p-type semiconductor substrate 1 to form a source region 2 and a drain region 3, a floating gate 5 electrically insulated from the semiconductor substrate 1 is formed on the surface of the semiconductor substrate 1 between the source region 2 and the drain region 3 with an insulation film 4 being interposed therebetween, and a control gate 7 is further formed on the floating gate 5 with an insulation film 6 being interposed therebetween.

When positive high voltages are respectively applied to the control gate 7 and the drain region 3 and the source region 2 is grounded to cause a current to flow between the source and the drain, hot electrons are produced in an end 3A of the drain region 3. The hot electrons pass through the insulation film 4 to be injected into the floating gate 5. Information is thus written.

The profile of the impurity concentration of a diffusion layer constituting the drain region 3 is rapidly changed in the boundary between the drain region 3 and a channel region 8. Consequently, a strong electric field is formed in the boundary between the channel region 8 and the drain region 3, so that hot electrons are easily generated.

When information is read out, the source region 2 is grounded and a predetermined positive voltage (for example, 2 volts) is applied to the drain region 3. In this state, a predetermined sense voltage is applied to the control gate 7. A threshold voltage Vth for allowing conduction between the source and the drain differs depending on the state of the floating gate 5. That is, the threshold voltage Vth is increased in a state where electrons are injected into the floating gate 5, while being decreased in a state where no electrons are injected. Therefore, the above-mentioned sense voltage is set to a voltage between the high threshold voltage and the low threshold voltage. The sense voltage is applied to the control gate 7, to watch whether or not conduction occurs between the source and the drain. If conduction occurs between the source and the drain, no electrons are injected into the floating gate 5, so that information stored in the memory cell is "0", for example. On the other hand, if no conduction occurs between the source and the drain, electrons are injected into the floating gate 5, so that information stored in the memory cell is "1". Information stored in the memory cell can be thus read out.

Stored information can be erased by irradiating ultraviolet rays to disperse the electrons in the floating gate 5 as well as by grounding the control gate 7 and applying a positive high voltage to the source region 2 to cause F-N tunneling of the electrons in the floating gate 5 into the source region 2.

Meanwhile, in the conventional memory cell, the impurity concentration of the drain region 3 is rapidly changed in the boundary between the drain region 3 and the channel region 8 so as to increase the production efficiency of hot electrons. The conventional memory cell has a structure in which hot electrons are very easily generated. Accordingly, trace amounts of hot electrons are generated even by a low voltage applied to the drain region 3 at the time of reading. Consequently, every time information is read out from the memory cell, trace amounts of hot electrons produced in the end 3A of the drain region 3 are injected into the floating gate 5. As a result, the threshold voltage Vth of the transistor is gradually changed. Such a phenomenon is generally referred to as soft writing.

FIG. 11 is a graph showing soft writing characteristics, which shows the results of measurement made taking as lifetime a time period during which the change of the threshold voltage Vth is kept at not more than 10 percent in a state where a read voltage $V_D$ is continuously applied to the drain region 3. Curves L1, L2, and L3 respectively correspond to cases where the gate length is set to 0.9 μm, 0.8 μm, and 0.7 μm. It is understood from FIG. 11 that the higher the read voltage $V_D$ is, the shorter the lifetime is. For example, assuming that it is required as resistance to soft writing that the shift of the threshold voltage Vth is not more than 10 percent in a continuously reading state over ten years, the read voltage $V_D$ must be suppressed to not more than 1.2 volts in the case of a cell having a gate length of 0.8 μm.

Since the voltage $V_D$ applied to the drain region 3 cannot be thus significantly increased at the time of reading, there is a limit on a read current of the memory cell. Therefore, the reading speed is prevented from being increased.

SUMMARY OF THE INVENTION

An object of the present invention is to solve the above-mentioned technical problems and to provide a semiconductor memory device capable of effectively preventing soft writing and a method of writing and reading out information for the semiconductor memory device.

The semiconductor memory device according to the present invention is so adapted that a read voltage which is opposite in polarity to that at the time of writing information is applied to the area between a source region and a drain region at the time of reading out information, and a predetermined sense voltage is applied to a control gate, thereby to prevent hot electrons or hot holes from being produced in the boundary between the drain region and a channel region at the time of reading out information. According to the present invention, therefore, the amount of charges stored in the floating gate is not changed at the time of reading out information, thereby to make it possible to reliably prevent so-called soft writing.

The foregoing and other objects, features, aspects and advantages of the present invention will become more apparent from the following detailed description

BRIEF DESCRIPTION OF THE DRAWINGS

FIG. 4(a) is a plane view, FIG. 4(b) is a cross sectional view as viewed from a cutting line IVb—IVb shown in FIG. 4(a), and FIG. 4(c) is a cross sectional view as viewed from a cutting line IVc—IVc shown in FIG. 4(a);

FIG. 5(a) is a plane view, FIG. 5(b) is a cross sectional view as viewed from a cutting line Vb—Vb shown in FIG. 5(a), and FIG. 5(c) is a cross sectional view as viewed from a cutting line Vc—Vc shown in FIG. 5(a);

FIG. 6(a) is a plane view, FIG. 6(b) is a cross sectional view as viewed from a cutting line VIb—VIb shown in FIG. 6(a), and FIG. 6(c) is a cross sectional view as viewed from a cutting line VIc—VIc shown in FIG. 6(a);

FIG. 7(a) is a plane view, FIG. (b) is a cross sectional view as viewed from a cutting line VIIb—VIIb shown in FIG. 7(a), and FIG. 7(c) is a cross sectional view as viewed from a cutting line VIIc—VIIc shown in FIG. 7(a);

FIG. 8(a) is a plane view, FIG. 8(b) is a cross sectional view as viewed from a cutting line VIIIb—VIIIb shown in FIG. 8(a), and FIG. 8(c) is a cross sectional view as viewed from a cutting line VIIIc—VIIIc shown in FIG. 8(a);

FIG. 9(a) is a plane view, FIG. 9(b) is a cross sectional view as viewed from a cutting line IXb—IXb shown in FIG. 9(a), and FIG. 9(c) is a cross sectional view as viewed from a cutting line IXc—IXc shown in FIG. 9(a);

DESCRIPTION OF THE PREFERRED EMBODIMENTS

Figure 1:
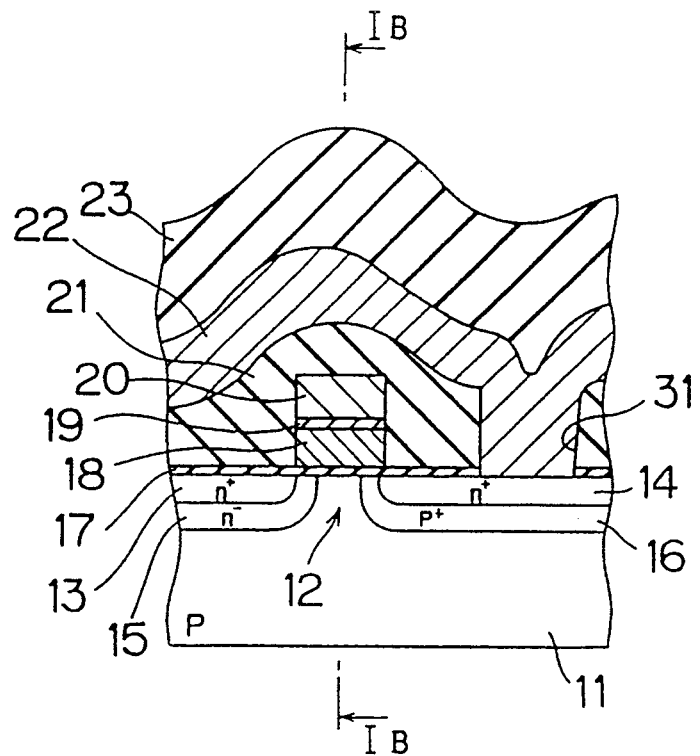
FIG. 1(a) is a cross sectional view showing the construction of a transistor constituting a memory cell which is applied to a semiconductor memory device according to one embodiment of the present invention.
FIG. 1(b) is a cross sectional view as viewed from a cutting line I—I shown in FIG. 1(a).
Figure 1:
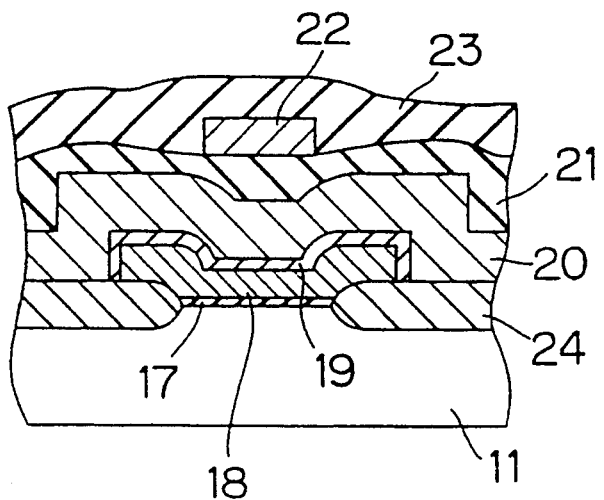

FIG. 1(a) is a cross sectional view showing the construction of a transistor constituting a memory cell of a semiconductor memory device according to one embodiment of the present invention, and FIG. 1(b) is a cross sectional view as viewed from a cutting line I—I shown in FIG. 1(a). An $n^+$-type source region 13 and an $n^+$-type drain region 14 are formed with a channel region 12 being interposed therebetween on a p-type semiconductor substrate 11. An $n^-$-type diffusion layer 15 is formed in the boundary between the source region 13 and the semiconductor substrate 11 so that the source region 13 has a structure withstanding high pressure (reducing a concentration of electric field in the boundary). In addition, a $p^+$-type diffusion layer 16 is formed in the boundary between the drain region 14 and the semiconductor substrate 11 so as to increase the production efficiently of hot electrons by forming a strong electric field in this boundary.

A tunnel oxide film 17, a floating gate 18, an ONO (Oxide-Nitride-Oxide) interlayer insulation film 19, and a control gate 20 are sequentially stacked on the surface of the channel region 12. An interlayer insulation film 21 is formed on the respective layers. A contact hole 31 is formed in the interlayer insulation film 21, and an aluminum interconnection 22 connected to the drain region 14 through the contact hole 31 is formed. In addition, a passivation film 23 covering the whole surface is formed. Reference numeral 24 shown in FIG. 1(b) denotes a field oxide film.

Figure 2:
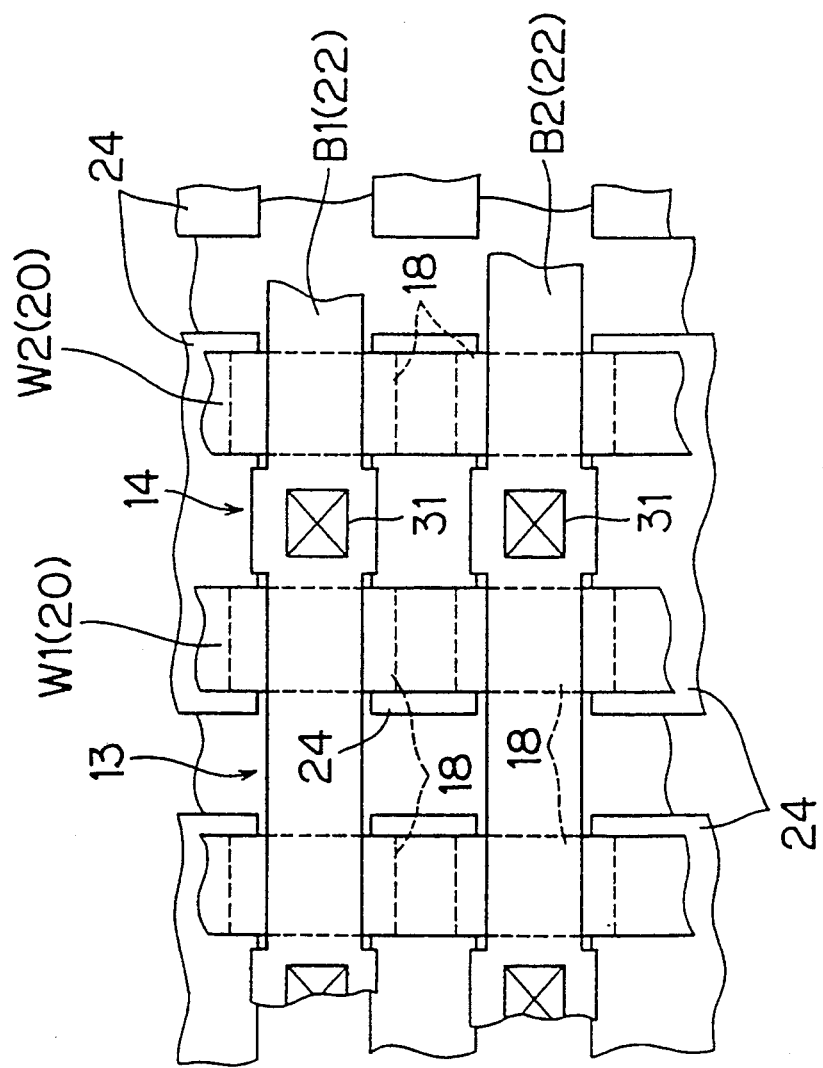
FIG. 2 is a plane view showing a part of an arrangement of memory cells of the semiconductor memory device according to the above-mentioned embodiment.

FIG. 2 is a plane view showing the arrangement of memory cells of the semiconductor memory device according to one embodiment in which the above-mentioned transistor is used as a memory cell, which shows the construction excluding the interlayer insulation film 21 and the passivation film 23. In FIG. 2, the same reference numerals are assigned to portions corresponding to the above-mentioned portions shown in FIGS. 1(a) and 1(b).

The control gate 20 is shared by a plurality of transistors aligned in a constant direction to form word lines W1, W2, . . . , and the aluminum interconnection 22 is connected together to respective drain regions 14 of transistors aligned in a direction intersecting the word lines W1, W2, . . . to form bit lines B1, B2, . . .

Figure 3:
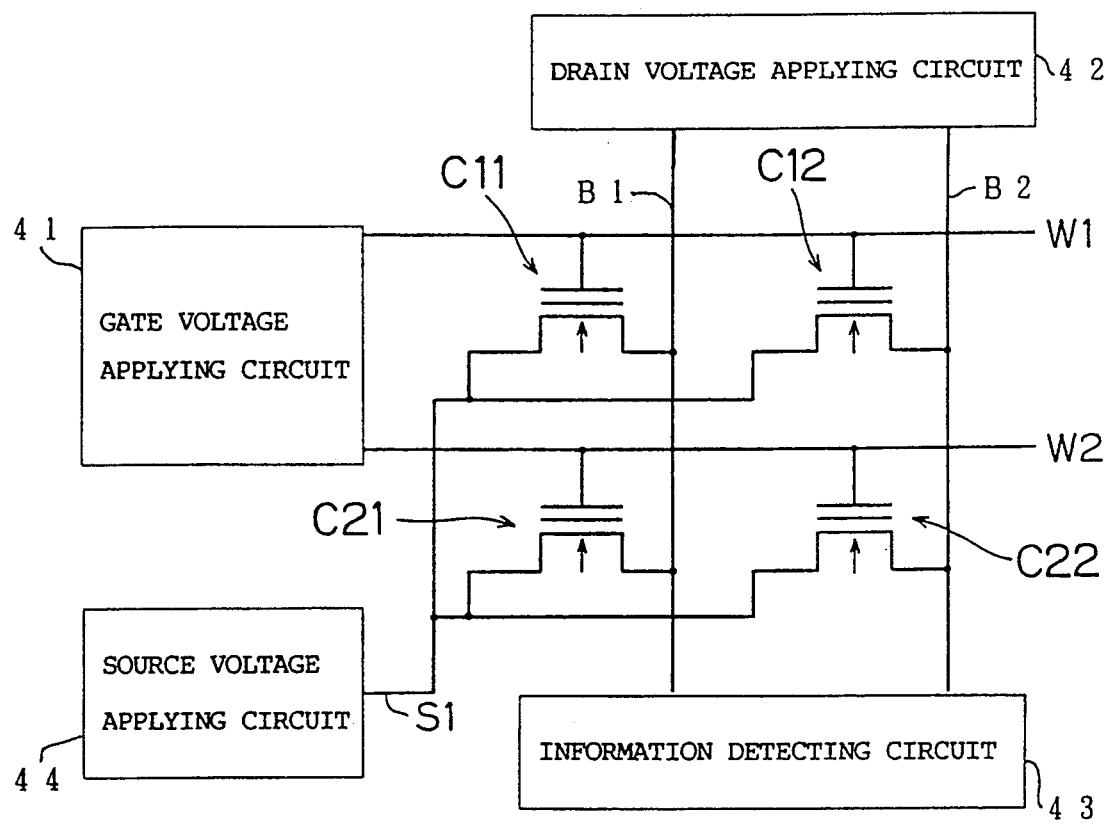
FIG. 3 is a circuit diagram showing the electrical construction of a part of the semiconductor memory device according to the above-mentioned embodiment.

FIG. 3 is an electric circuit diagram illustrating the semiconductor memory device according to one embodiment of the present invention, which shows the circuit arrangement of adjacent four memory cells C11, C12, C21 and C22. A word line W1 connected to control gates of the memory cells C11 and C12 and a word line W2 connected to control gates of the memory cells C21 and C22 are connected to a gate voltage applying circuit 41. The gate voltage applying circuit 41 selectively applies a write voltage or a read voltage (namely sense voltage) as described later to the word line W1 or W2. In addition, a bit line B1 is connected to drains of transistors constituting the memory cells C11 and C21, and a bit line B2 is connected to drains of transistors constituting the memory cells C12 and C22. The bit lines B1 and B2 are connected to a drain voltage applying circuit 42 and an information detecting circuit 43. The drain voltage applying circuit 42 is a circuit for selectively applying a write voltage to the bit line B1 or the bit line B2 at the time of writing information as described later. On the other hand, the information detecting circuit 43 is used for detecting a potential appearing on the bit line B1 or the bit line B2 to determine whether information stored in the memory cell is "0" or "1" at the time of reading out information, as described later.

Furthermore, sources of the transistors constituting the respective memory cells C11, C12, C21 and C22 are connected together to a line S1. The line S1 is connected to a source voltage applying circuit 44. The source voltage applying circuit 44 is used for applying predetermined voltages to the sources of the respective transistors through the line S1 at the time of reading out information stored in the memory cell or erasing information stored in the memory cell as described later.

The following table 1 collectively shows voltages applied to the word lines W1 and W2, the bit lines B1 and B2, and the line S1 as well as the semiconductor substrate 11 in respective cases where information is written, read out and erased with respect to the memory cell C11. Description is now made of the respective operations of writing, reading and erasing information with respect to the memory cell C11 on the basis of the Table 1.

TABLE 1

| operation | B1 | B2 | W1 | W2 | S1 | Substrate |
|---|---|---|---|---|---|---|
| | | (unit: volt) | | | | |
| write | 6.5 | 0 | 12 | 0 | 0 | 0 |
| read | 0 | 2*1 | 5 | 0 | 2 | 0 |
| erase | opened | opened | 0 | 0 | 12 | 0 |

*1 may be "opened"

WRITING OPERATION

In writing information to the memory cell C11, a high voltage of 6.5 volts is applied to the bit line B1 by the drain voltage applying circuit 42 and a high voltage of 12 volts is applied to the word line W1 by the gate voltage applying circuit 41, and the line S1 is brought into a ground potential by the source voltage applying circuit 44. Consequently, in the transistor constituting the memory cell C11, hot electrons are produced due to a strong electric field produced in the boundary between the drain region 14 and the channel region 12. The hot electrons are stored in the floating gate 18 through the tunnel oxide film 17. Both the word line W2 and the bit line B2 are brought into a ground potential by the gate voltage applying circuit 41 and the drain voltage applying circuit 42, so that the memory cells C12, C21 and C22 enter a non-selected state.

A gate voltage required to allow conduction between the source and the drain varies depending on a state where electrons are stored in the floating gate 18 and a state where no electrons are stored therein. That is, a threshold voltage for allowing conduction between the source and the drain in the state where electrons are injected into the floating gate 18 is higher. Binary data "1" or "0" can be stored in each of the memory cells by thus setting the threshold voltage to either one of two types of threshold voltages.

READING OPERATION

In reading out information from the memory cell C11, a sense voltage of 5 volts is applied to the word line W1 by the gate voltage applying circuit 41. At this time, no voltage is applied to the word line W2. In addition, only the bit line B1 is brought into a zero potential by the drain voltage applying circuit 42. Furthermore, a positive voltage of 2 volts is applied to the line S1 by the source voltage applying circuit 44. A read voltage applied across the area between the source and the drain of the memory cell C11 (the voltage applied to the line S1 minus the voltage applied to the bit line B1) is thus the write voltage applied across the same area opposite in polarity to at the time of writing. In addition, at the time of applying this inverted voltage, a voltage applied to the drain of the transistor constituting the memory cell C11 is made zero.

If the voltage applied to the drain is made zero so that no positive voltage is applied, hot electrons are prevented from being produced between the drain region 14 and the substrate 11, so that the change in charges stored in the floating gate 18 is restrained. On the other hand, the boundary between the source region 13 and the semiconductor substrate 12 has a structure withstanding high pressure by the n⁻-type diffusion layer 15, so that no hot electrons are produced in this boundary. Consequently, in the above-mentioned reading operation accompanied by the application of a voltage, it is possible to effectively prevent so-called soft writing.

The sense voltage is a voltage intermediate between a threshold voltage in a case where no electrons are stored in the floating gate 18 and a threshold voltage in a state where electrons are stored therein. Consequently, if the sense voltage is applied, conduction/non-conduction between the source and the drain is determined depending on whether or not electrons are stored in the floating gate 18. The word line W2 is brought into a zero potential, and the same voltage of 2 volts as that applied to the line S1 is applied to the bit line B2 or the bit line B2 is brought into an opened state.

When no electrons are stored in the floating gate 18, the threshold voltage is lower than the sense voltage, so that conduction occurs between the source and the drain of the memory cell C11. Consequently, the voltage of 2 volts applied to the line S1 is applied to the bit line B1, so that a potential on the bit line B1 is increased from zero to 2 volts. On the other hand, when electrons are stored in the floating gate 18, the threshold voltage is higher than the sense voltage, so that the memory cell C11 is kept in a non-conduction state. Accordingly, the potential on the bit line B1 remains zero. Consequently, the above-mentioned respective voltages are applied to the word lines W1 and W2, the bit lines B1 and B2 and the line S1 by the respective voltage applying circuits 41, 42 and 44, and the change of the potential on the bit line B1 is examined by the information detecting circuit 43, thereby to make it possible to read out information stored in the memory cell C11.

Moreover, in a case where the information detecting circuit is connected to the source of the memory cell C11, when the memory cell C11 is kept in a conductive state, the voltage of zero applied to the bit line B1 is applied to the source line S1, so that a potential on the source line S1 is decreased from 2 volts to zero. On the other hand, when the memory cell C11 is kept in a non-conductive state, a potential on the source line is kept 2 volts. Consequently, it is possible to read out information stored in the memory cell C11 from the source.

Meanwhile, which of the application of the voltage of 2 volts to the line S1 by the source voltage applying circuit 44 and the application of the sense voltage to the word line W1 by the gate voltage applying circuit 41 may be first achieved. The change of the potential on the bit line B1 before and after the application of the voltage applied later is watched, thereby to make it possible to read out stored information.

As described in the foregoing, the source region 13 has a structure withstanding high pressure. Even if a somewhat higher voltage is applied to the source region 13 at the time of reading, therefore, no soft writing occurs. Consequently, a current from the bit line B1 can be increased by setting the read voltage applied to the source region 13 to a relatively high voltage, thereby to make it possible to improve the reading speed and accurately read out information.

When the voltages are applied as shown in the Table 1, the same voltage as that applied to the line S1 is applied to the bit line B2 (or the bit line B2 is brought into an opened state), so that the memory cells C12 and C22 are kept in a non-conduction state without depending on the voltages applied to the word lines W1 and W2. In addition, since no sense voltage (e.g. 5 volts) is applied to the word line W2, the memory cell C21 is kept in a non-conduction state without depending on the state of the bit line B1.

ERASING OPERATION

The erasing operation is performed with respect to all the memory cells C11, C12, C21 and C22. That is, the bit lines B1 and B2 are brought into an opened state, while the word lines W1 and W2 are brought into a ground potential. In addition, a high voltage of 12 volts is applied to the line S1. Consequently, electrons stored in the floating gate 18 are emitted to the source region 13, so that the floating gates 18 in all the cells enter a state where no electrons are stored, to erase information stored in all the cells.

As described in the foregoing, according to the present invention, in reading out stored information, the voltage between the source and the drain of the transistor constituting the memory cell is made opposite in polarity to that at the time of writing stored information. That is, a positive high voltage (e.g. 6.5 volts) is applied to the drain region 14 at the time of writing, while a positive voltage is applied to the source region 13 at the time of reading. The boundary between the source region 13 and the semiconductor substrate 11 has a structure withstanding high pressure. Accordingly, even if a positive voltage is applied to the source region 13 at the time of the reading operation, no hot electrons are produced, thereby eliminating the possibility of causing soft writing. In such a manner, according to the present embodiment, it is possible to satisfactorily hold stored information by effectively preventing soft writing.

Figure 4:
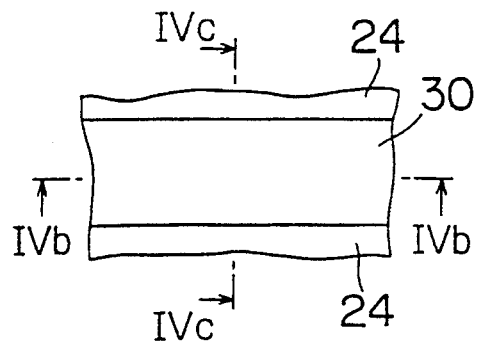
FIGS. 4(a), 4(b), 4(c) are diagrams for explaining a method of manufacturing the semiconductor memory device according to the above-mentioned embodiment, where
Figure 4:
Figure 4:
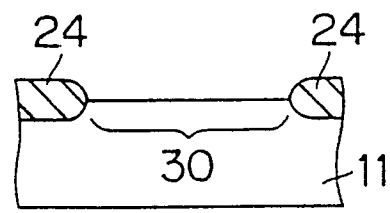

Description is now made of a method of manufacturing a memory cell of the above-mentioned semiconductor memory device with reference to FIGS. 4 to 9. As shown in FIG. 4, a field oxide film 24 is first formed on a semiconductor substrate 11 by the LOCOS (Local Oxidation of Silicon) process, to separate an active region 30. FIG. 4(a) is a plane view, FIG. 4(b) is a cross sectional view as viewed from a cutting line IVb—IVb shown in FIG. 4(a), and FIG. 4(c) is a cross sectional view as viewed from a cutting line IVc—IVc shown in FIG. 4(a). In each of FIGS. 5 to 9, the correspondence among (a) to (c) is the same as the above-mentioned correspondence shown in FIG. 4.

Figure 5:
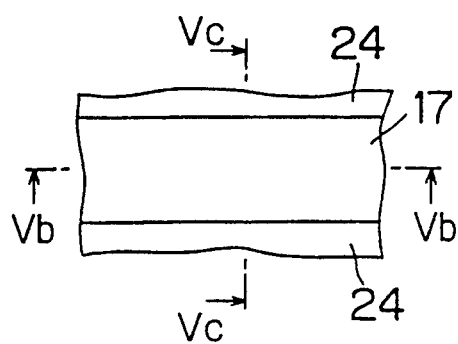
FIGS. 5(a), 5(b), 5(c) are diagrams for explaining a method of manufacturing the semiconductor memory device according to the above-mentioned embodiment, where
Figure 5:
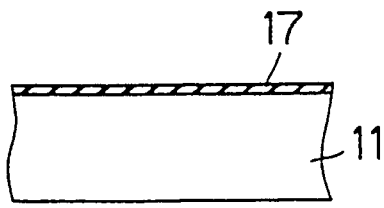
Figure 5:
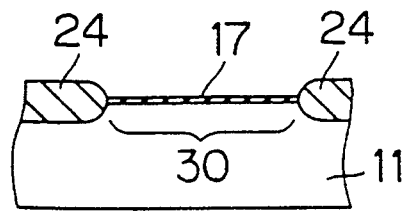

As shown in FIG. 5, a tunnel oxide film 17 is then formed on the surface of the semiconductor substrate 11 in a portion of the active region 30. The thickness of the tunnel oxide film 17 is, for example, approximately 10 nm.

Figure 6A:
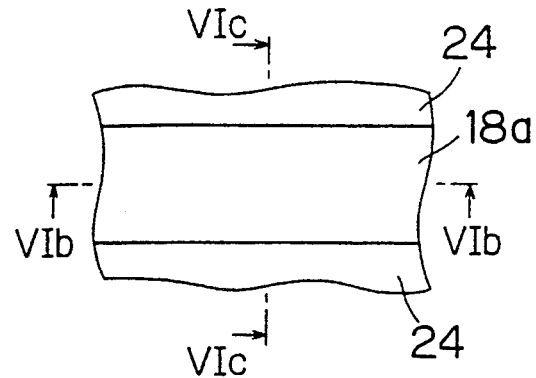
FIGS. 6(a), 6(b), 6(c) are diagrams for explaining a method of manufacturing the semiconductor memory device according to the above-mentioned embodiment, where
Figure 6B:
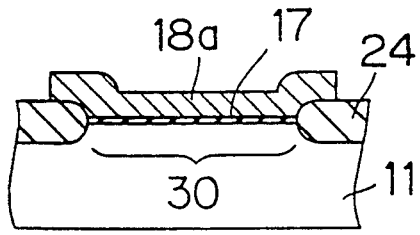
Figure 6C:
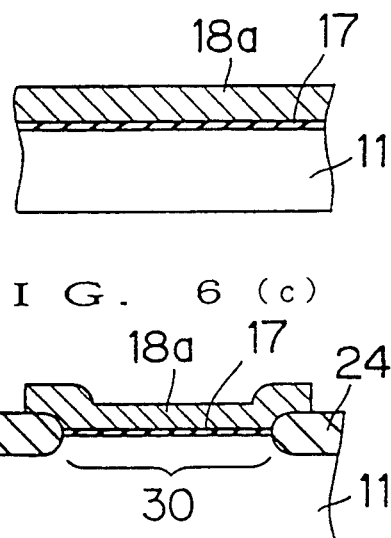

As shown in FIG. 6, a polysilicon film 18a for a floating gate 18 is subsequently formed on the active region 30 with it being stacked on the tunnel oxide film 17. Phosphorus is added to the polysilicon film 18a, so that the resistance of the polysilicon film 18a is decreased.

Figure 7A:
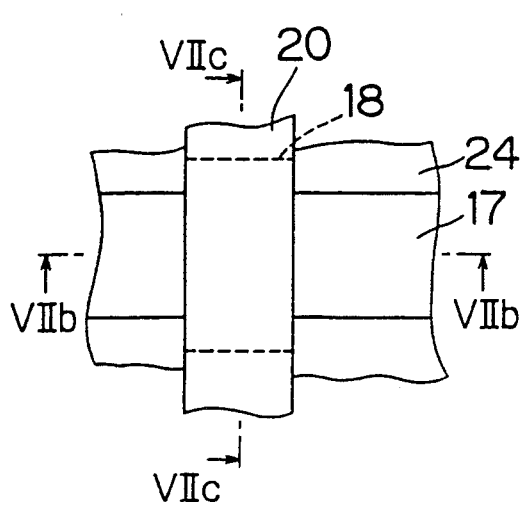
FIGS. 7(a), 7(b), 7(c) are diagrams for explaining a method of manufacturing the semiconductor memory device according to the above-mentioned embodiment, where
Figure 7B:
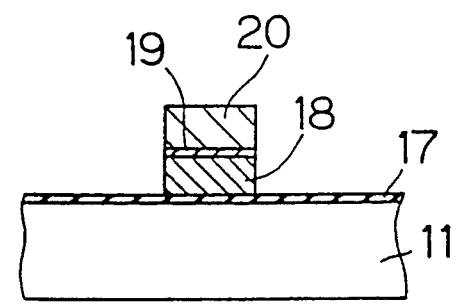
Figure 7C:
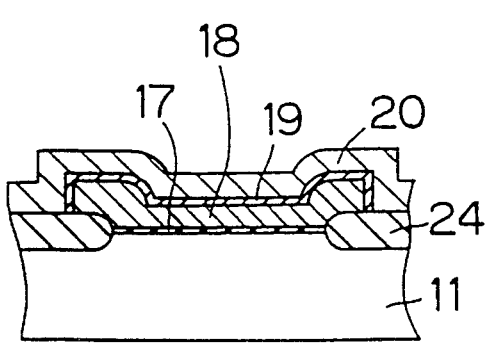

As shown in FIG. 7, an ONO interlayer insulation film 19 and a control gate 20 are then patterned in a stacked state. In patterning the control gate 20, the polysilicon film 18a (see FIG. 6) in the area corresponding to a source region or a drain region is simultaneously removed, so that the floating gate 18 patterned is obtained. A film having a structure in which a silicon nitride film is interposed between, for example, a pair of silicon oxide films is applied to the interlayer insulation film 19.

Figure 8:
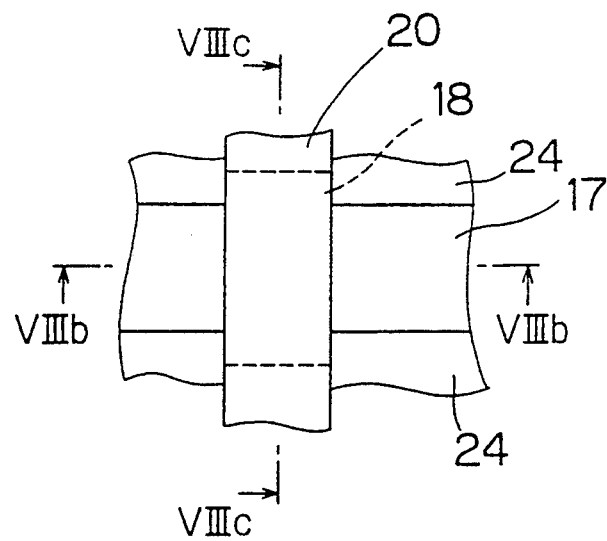
FIGS. 8(a), 8(b), 8(c) are diagrams for explaining a method of manufacturing the semiconductor memory device according to the above-mentioned embodiment, where
Figure 8:
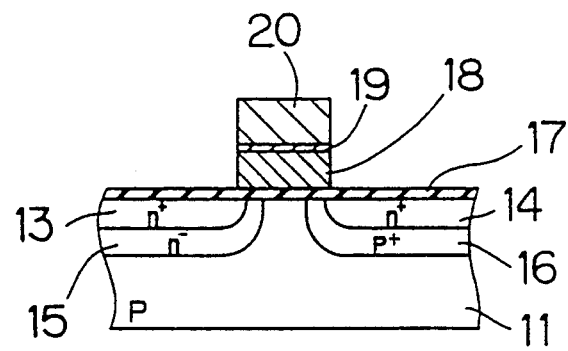
Figure 8:
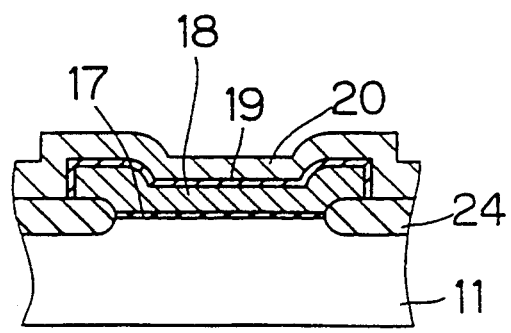

In this state, boron ions are implanted and arsenic ions are implanted, to form a drain region 14 and a $p^+$-type diffusion layer 16. In addition, arsenic ions and phosphorous ions are implanted, to form an $n^+$-type source region 13 having a structure withstanding high pressure having an $n^-$-type diffusion layer 15 in its periphery. This state is shown in FIG. 8.

Figure 9A:
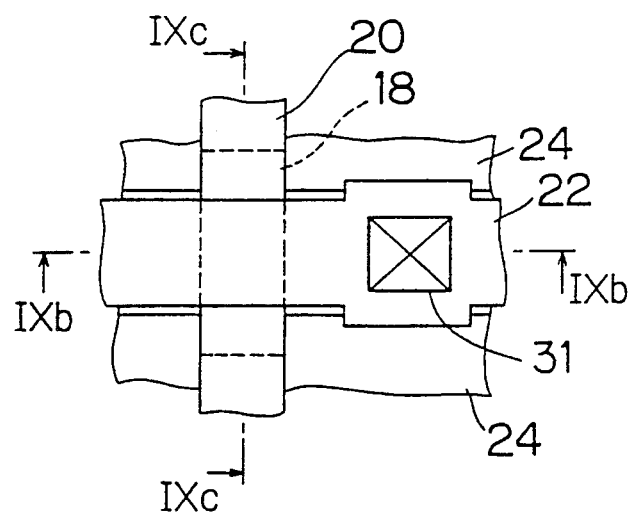
FIGS. 9(a), 9(b), 9(c) are diagrams for explaining a method of manufacturing the semiconductor memory device according to the above-mentioned embodiment, where
Figure 9B:
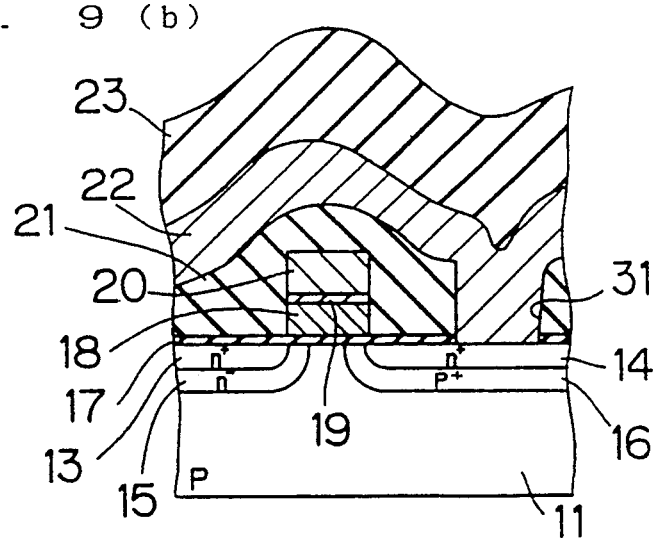
Figure 9C:
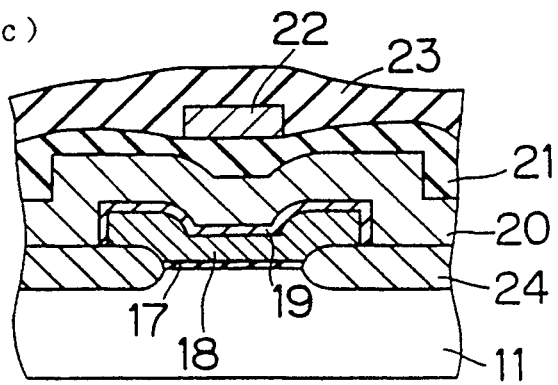
Figure 10:
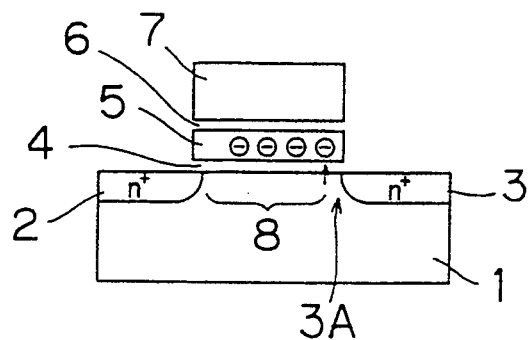
FIG. 10 is a cross sectional view showing the construction of a transistor constituting a memory cell which has been conventionally applied to a semiconductor memory device.
Figure 11:
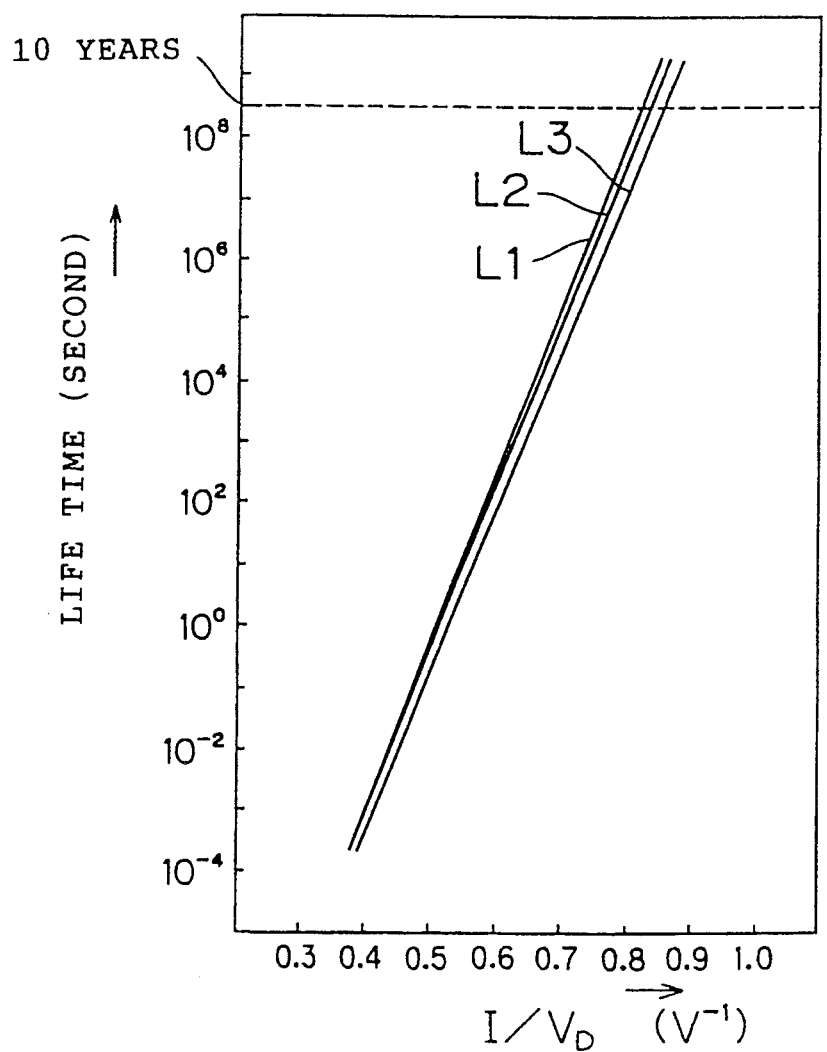
FIG. 11 is a graph showing soft writing characteristics in a conventional semiconductor memory device.

As shown in FIG. 9, an interlayer insulation film 21 is subsequently formed. In this interlayer insulation film 21, a contact hole 31 is formed above the drain region 14. An aluminum interconnection 22 connected to the drain region 14 through the contact hole 31 is formed. In this state, the entire surface is covered with a passivation film 23. In such a manner, the transistor constituting the memory cell having the structure shown in FIG. 1 is obtained.

Meanwhile, the present invention is not limited to the above-mentioned embodiment. For example, although in the above-mentioned embodiment, description was made of a case where hot electrons are produced in the boundary between the drain region 13 and the channel region 12 and the hot electrons are injected into the floating gate 18 to write information, the present invention is easily applicable to a case where hot holes are produced in the boundary between the drain region and the channel region and the hot holes are injected into the floating gate to write information. That is, also in this case, a voltage having a polarity applied to the drain region at the time of writing is applied to the source region having a structure withstanding high pressure at the time of reading, thereby to make it possible to satisfactorily read out stored information while effectively preventing soft writing.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a memory cell comprising a transistor having a source region and a drain region formed on a semiconductor substrate, a channel region so formed as to be interposed between said source region and said drain region, a first boundary between said drain region and said semiconductor substrate having means for increasing a production of hot electrons or hot holes in said first boundary, a second boundary between said source region and said semiconductor substrate having a means for restraining a production of hot electrons or hot holes in said second boundary, a floating gate formed above the channel region with it being electrically insulated from the channel region, and a control gate formed on the floating gate;

writing operation control means for applying such a write voltage across an area between said drain region and said source region that a potential in the drain region is relatively higher than a potential in the source region and applying a predetermined write control voltage to said control gate so as to write information to said memory cell, thereby to allow conduction between said drain region and said source region as well as produce hot electrons or hot holes in a boundary between said drain region and said channel region and inject the hot electrons or hot holes into said floating gate;

reading operation control means for applying a read voltage, opposite in polarity to that of said write voltage, across the area between said drain region and said source region so that the potential in the source region is relatively higher than the potential in the drain region and applying a predetermined sense voltage to said control gate so as to read out the information written in said memory cell; and information detecting means for detecting the information written in said memory cell by detecting a potential appearing in said drain region or in said source region in a case where said read voltage and said sense voltage are applied by the reading operation control means.

2. A semiconductor memory device according to claim 1, wherein said means for restraining a production of hot electrons or hot holes in said second boundary includes a diffusion layer having an impurity concentration lower than an impurity concentration of said source region, and said means for increasing a production of hot electrons or hot holes in said first boundary includes a diffusion layer between said drain region and said substrate and having an impurity concentration higher than an impurity concentration of said drain region.

3. A semiconductor memory device according to claim 1, further comprising erasing operation control means for applying voltages to said source/drain region and said control gate, such that charge carriers stored in said floating gate are emitted to said source/drain region, thereby to erase information stored in said memory cell.

4. A semiconductor memory device, comprising:
a) a memory cell, including
   a first conductivity type semiconductor substrate,
   a source/drain region including a source region and a drain region, both of a second conductivity type, formed on said substrate,
   a channel region formed in a surface region of said substrate and located between said source region and said drain region,
   a floating gate formed above said channel region so as to be electrically insulated therefrom,
   a control gate on said floating gate,
   means, at a first boundary between said source region and said channel region, for lessening an electric field concentration between said source region and said channel region, and
   means, at a second boundary between said drain region and said channel region, for increasing an electric field concentration between said drain region and said channel region;
b) writing operation control means for applying a write voltage across an area between said source region and said drain region, such that a potential in said drain region is relatively higher than a potential in said source region, and applying a predetermined write control voltage to said control gate so as to write information to said memory cell, thereby to allow conduction between said drain region and said source region as well as produce hot charge carriers in said second boundary and inject the hot charge carriers into said floating gate;
c) reading operation control means for applying a read voltage, opposite in polarity to that of said write voltage, across the area between said source region and said drain region, such that a potential in said source region is relatively higher than a potential in said drain region, and applying a predetermined sense control voltage to said control gate so as to read out the information written in said memory cell, the electric field lessening means preventing production of hot carriers in said first boundary; and
d) information detecting means for detecting the information written in said memory cell by detecting a potential appearing in said drain region or in said source region, when said read voltage and said sense voltage are applied by said reading operation control means.

5. The semiconductor memory device according to claim 4, wherein
said writing operation control means brings the source region into a ground potential and respectively applies predetermined positive voltages to the drain region and the control gate at the time of writing information to said memory cell.

6. The semiconductor memory device according to claim 4, wherein
said reading operation control means brings the drain region into a zero potential and applies a predetermined positive read voltage to the source region at the time of reading out information from said memory cell.

7. The semiconductor memory device according to claim 6, wherein
the predetermined sense voltage applied to said control gate by said reading operation control means is set to a voltage at which no conduction occurs between said source region and said drain region when electrons are stored in said floating gate, while conduction occurs between said source region and said drain region when no electrons are stored in said floating gate.

8. The semiconductor memory device according to claim 7, wherein
said drain region comprises an $n^+$-type impurity region having a high concentration formed on a p-type semiconductor substrate, and a $p^+$-type diffusion layer is formed in the boundary between said drain region and said semiconductor substrate so that hot electrons are easily produced.

9. The semiconductor memory device according to claim 6, wherein
the predetermined sense voltage applied to said control gate by said reading operation control means is set to a voltage at which conduction occurs between said source region and said drain region when holes are stored in said floating gate, while no conduction occurs between said source region and said drain region when no holes are stored in said floating gate.

10. A semiconductor memory device according to claim, 4, wherein said means for lessening an electric field concentration includes a diffusion layer of the second conductivity type bounding said source region and having an impurity concentration lower than an impurity concentration of said source region, and said means for increasing an electric field concentration includes a diffusion layer of the first conductivity type bounding said drain region and having an impurity concentration higher than an impurity concentration of said drain region.

11. A semiconductor memory device according to claim 10, wherein the first conductivity type is p-type, said second conductivity type is $n^+$-type and said hot carriers are hot electrons.

12. A semiconductor memory device according to claim 4, further comprising erasing operation control means for applying voltages to said source/drain region and said control gate, such that charge carriers stored in said floating gate are emitted to said source/drain region, thereby to erase information stored in said memory cell.

* * * * *